United States Patent [19]

Manasevit

[11] Patent Number: 4,661,176

[45] Date of Patent: Apr. 28, 1987

[54] PROCESS FOR IMPROVING THE QUALITY OF EPITAXIAL SILICON FILMS GROWN ON INSULATING SUBSTRATES UTILIZING OXYGEN ION CONDUCTOR SUBSTRATES

[75] Inventor: Harold M. Manasevit, Anaheim, Calif.

[73] Assignee: The United States of America as represented by the Secretary of the Air Force, Washington, D.C.

[21] Appl. No.: 706,205

[22] Filed: Feb. 27, 1985

[51] Int. Cl.$^4$ ............... H01L 21/20; H01L 21/76
[52] U.S. Cl. ............... 148/175; 29/576 E; 29/576 T; 148/1.5; 148/189; 148/191; 148/DIG. 3; 148/DIG. 117; 148/DIG. 150; 156/612; 156/613; 156/614; 156/DIG. 64; 156/DIG. 73; 156/DIG. 95; 357/4; 357/49
[58] Field of Search ............ 148/1.5, 175, 189, 191, 148/DIG. 3, DIG. 117, DIG. 150; 156/612–614, DIG. 64, DIG. 73, DIG. 95; 29/576 T, 576 E; 357/4, 49

[56] References Cited

U.S. PATENT DOCUMENTS

| 4,116,751 | 9/1978 | Zaromb | 156/600 |
| 4,177,084 | 12/1979 | Lav et al. | 148/1.5 |
| 4,177,321 | 12/1979 | Nishizawa | 148/175 X |
| 4,275,093 | 6/1981 | Sasaki et al. | 156/DIG. 64 |
| 4,447,497 | 5/1984 | Manasevit | 428/446 |
| 4,540,452 | 9/1985 | Croset et al. | 29/576 E |

OTHER PUBLICATIONS

Manasevit et al., "Si on Cubic Zirconia", J. Electrochem. Soc., vol. 130, No. 8, Aug. 1983, pp. 1752–1757.
Golecki et al., "Heteroepitaxial Si Film . . . Zirconia Substrates", Appl. Physics Letters, vol. 42, No. 6, Mar. 15, 1983, pp. 501–503.
I. Golecki "The Current Status of Silicon-on-Sapphire and Other Heteroepitaxial Si-on-Insulator Technologies", presented at the Spring Meeting of the Materials Research Society, Albuquerque, New Mexico, Feb. 1984.
I. Golecki, H. M. Manasevit "Oxidation Through the Zirconia Substrate of Ytria-Stabilized Cubic Zirconia", presented at Electronic Materials Conference Materials Conference Jun. 20–22, 1984, Santa Barbara, Calif.—describes invention, submitted for publication to Journal of Electronic Materials in Feb. 1985.
D. Pribat et al., "Heteroepitaxial Growth of Silicon on (100) Ytria-Stabilized Zirconia (YSZ) and Thermal Oxidating of the Si-YSZ Interface", Material Letter 2,524 (Sep. 1984)—publication describing substance of Hum patent application by others.
L. M. Mercandelli et al., "Epitaxial Silicon on Ytria-Stabilized Cubic Zirconia (YSZ) and Subsequent Oxidation of the Si/YSZ Interface," Material Research Soc. Conference, Boston, 1984 (Nov.) paper #D.3.12.
M. Duprey "Observations en Microscopic Electronique en Transmission de Coupes Transversales, Minces pour des Applications en Microelectronique", J. Microsc Spectrosc. Electron 9, 163 (1984).
I. Golecki "Alternate Substrate Material: Silicon on Ytria Stabilized Cubic Zirconia (Si/YSZ)", Final Report AFWAL-TR-83-4137 Jan. 1984.

Primary Examiner—William G. Saba
Attorney, Agent, or Firm—Stanton E. Collier; William J. O'Brien; Donald J. Singer

[57] ABSTRACT

The present invention accomplishes the thermal oxidation of the silicon side of the interface present in epitaxial silicon films grown on yttria-stabilized cubic zirconia, <Si>/<YSZ>, to form a dual-layer structure of <Si>/amorphous $SiO_2$/<YSZ>. The $SiO_2$ films are formed in either dry oxygen (at 1100° C.) or in pyrogenic steam (at 925° C.) by the rapid diffusion of oxidizing species through a 425 μm thick cubic zirconia substrate. For instance, a 0.17 μm thick $SiO_2$ layer is obtained after 100 min in pyrogenic steam at 925° C. This relatively easy transport of oxidants is unique to YSZ and other insulators which are also superionic oxygen conductors, and cannot be achieved in other existing Si/insulator systems, such as silicon-on-sapphire.

18 Claims, No Drawings

PROCESS FOR IMPROVING THE QUALITY OF EPITAXIAL SILICON FILMS GROWN ON INSULATING SUBSTRATES UTILIZING OXYGEN ION CONDUCTOR SUBSTRATES

STATEMENT OF GOVERNMENT INTEREST

The invention described herein may be manufactured and used by or for the Government for governmental purposes without the payment of any royalty thereon.

BACKGROUND OF THE INVENTION

This invention relates to epitaxial silicon films and to a method for improving their quality. In a more particular aspect, this invention concerns itself with improving the quality of silicon films previously deposited on insulating substrates.

The recent interest in the use of integrated circuit technology has spawned a considerable research effort in an attempt to develop high quality materials for use in integrated circuits requiring radiation-hard, high speed and high density properties. Amongst the materials developed for use in integrated circuits are single crystal silicon films. Generally, these films are deposited onto insulating substrates using convention epitaxial deposition techniques. For example, the chemical vapor deposition (CVD) of silicon as an epitaxial layer onto a sapphire substrate (SOS) has provided a state-of-the art material useful in fabricating large scale integrated circuits. These silicon coated substrates are generally available as 3 to 4 inch diameter wafers. Unfortunately, the silicon coated sapphire substrates (SOS) do not possess the requisite properties needed for high speed circuitry operations. Although 0.5-0.6 $\mu$m thick SOS films are routinely used for fabricating large-scale integrated circuits, using metal-oxide-semiconductor (MOS) and field-effect transistors (FETs) with dimensions down to, and sometimes below 2 $\mu$m, carrier mobilities are limited by the extended lattice defects and $\simeq -4 \times 10^{-3}$ compressive in-plane strain present in these SOS films. Typical field-effect electron and hole mobilities in CVD SOS are $\mu_{eFE} = 400$-$500$ cm$^2$/Vs and $\mu_{hFE} = 150$-$200$ cm$^2$/Vs, respectively. These values are below those obtained bulk silicon, and are a limiting factor in circuit speed. In addition, the sub-threshold backside leakage current in SOS devices is relatively high, due to the highly defective near-interface region in the silicon films. The compressive strain present in SOS films at room-temperature is attributed to the higher thermal expansion coefficient of sapphire, compared to that of silicon. During cooling from the silicon deposition temperature, typically 900°-1000° C., to room-temperature, the thin silicon film is forced to follow the larger contraction of the much thicker (18 mil or 0.46 mm) sapphire wafer. The measured strain in SOS is about 85% of the expected value. The remaining 15% is presumably relieved into the observed stacking faults, microtwins, and dislocations. The concentration of these extended lattice defects is highest at the Si/Al$_2$O$_3$ interface, and decreases away from it. However, the silicon surface is not free of these defects, and its crystalline quality is substantially poorer than that of bulk silicon, even for films as thick as 1 $\mu$m. There are additional drawbacks of using sapphire (Al$_2$O$_3$) as a substrate for silicon. First, it is structurally mismatched to silicon, since Al$_2$O$_3$ is rhombohedral and silicon is diamond-cubic, thus resulting in complicated epitaxial relationships. Secondly, the lattice spacings are different by $\simeq 10\%$, although the exact bonding configuration at the Si/Al$_2$O$_3$ interface at the deposition temperature is unknown. Thirdly, it contains aluminum, which under certain growth or processing conditions can become incorporated in the silicon film, thus doping it p-type.

Insulators other than sapphire have been used in the past as substrates for Si heteroepitaxy. Examples are spinel, MgOAl$_2$O$_3$; beryllium oxide, BeO; and silicon carbide, $\alpha$-SiC. However, no bulk insulator substrate other than sapphire has been commercialized and put to practical use for silicon dielectric isolation.

In an attempt to overcome the problems associated with using sapphire as a substrate for silicon, it has been suggested that yttria-stabilized cubic zirconia be utilized as a suitable substitute for sapphire.

Pure zirconia is monoclinic, but can be obtained in the cubic fluorite structure by adding a suitable additive, such as CaO or Y$_2$O$_3$. Calcia-stabilized or yttria-stabilized zirconia (CSZ or YSZ, respectively) are defect solid solutions, in which the defects are oxygen vacancies, created to preserve lattice neutrality when Ca$^{+2}$ or Y$^{+3}$ ions are substituted for Zr$^{+4}$ ions The cubic zirconias belong to a family of materials known as superionic conductors. These materials differ from insulators such as sapphire, in that (1) the transport of charge is effected by only one ionic species, O$^{--}$ ions in the case of cubic zirconia, and not by both species, and (2) the conductivity is much higher reaching, at a sufficiently high temperature, values similar to those found for semiconductors.

At room temperature, however, YSZ is an excellent insulator. As a rule, the conductivity in the stabilized zirconias is highest for the smallest concentration of additive (yttria) needed to stabilize the cubic phase, and then decreases. The high oxygen ionic conductivity in YSZ signifies a high oxygen mobility and constitutes an added degree of freedom.

In the past, the use of cubic zirconia has been limited to its high-temperature ionic-oxygen-conducting properties, e.g., as an oxygen gauge or pump, often as part of an electrochemical cell. For such uses, polycrystalline material (bulk or thin film) was sufficient. Single-crystal material in relatively large size (up to 2 inches) and of high qaulity has become available recently through the use of cubic zirconia as a diamond substitute in the jewel industry.

In addition to its cubic crystal structure, stabilized zirconia is better lattice-matched to silicon than sapphire is. On the other hand, other properties of YSZ are less favorable than those of sapphire. Its thermal expansion coefficient is higher by about 30% than that of sapphire. Its thermal conductivity is very poor compared to that of Al$_2$O$_3$, making YSZ more susceptible to, thermal shock, and limiting power dissipation through it. Its dielectric constant is higher than that of Al$_2$O$_3$ resulting in potentially higher stray capacitance in integrated circuits; however, it's known that this problem can be minimized by proper design of circuit layout.

An additional practical drawback is that the as-grown YSZ crystals are randomly oriented, since at present they are obtained using a seedless process, called skull melting. In this technique, a specially shaped radio frequency apparatus is used for melting the source powders at $\simeq 2700°$ C. As the melt is slowly lowered through the hot zone, spontaneous, random nucleation of single-crystal grains takes place in a skull of the same composition. Grains which are several inches long and 3-4 square inches in cross-section are obtained routinely. The grain size can be controlled by the growth conditions, and is related to the size of the skull. Sapphire, on the other hand, has a lower melting point of ≃2050° C. and is usually grown by the well known Czochralski technique using a seed of the desired orientation. To summarize, the main advantages of cubic zirconia over sapphire are its cubic structure, smaller lattice mismatch to silicon, and its high oxygen ion mobility at elevated temperatures.

The use of heteroepitaxial silicon deposition films on sapphire substrates as structural materials for use in fabricating integrated circuits has encountered some success. However, in using such films, it is a desirable objective to reduce the compressive stress and the concentration of crystallographic defects in the films, in order to increase the carrier mobilities and reduce the subthreshold leakage currents in the devices. In an attempt to achieve this objective, it has been found that silicon deposited films of very high quality can be produced by a method which utilizes the high mobility of oxidizing species in YSZ to oxidize the silicon side of the Si/YSZ interface, resulting in a dual-layer structure <Si>/amorphous $SiO_2$/<YSZ>. The method of this invention is unique to insulators that are oxygen superionic conductors, such as YSZ.

Accordingly, the primary object of this invention is to provide a novel method for treating silicon epitaxial films previously deposited onto insulating yttria-stabilized cubic zirconia substrates.

Another object of this invention is to provide a method for reducing the compressive stress and the concentration of crystallographic defects in silicon films previously deposited onto yttria-stabilized cubic zirconia substrates.

The above and still other objects and advantages of the present invention will become more readily apparent upon consideration of the following detailed description thereof.

DESCRIPTION OF THE PREFERRED EMBODIMENT

Pursuant to the above defined objects, the present invention provides a novel method for treating heteroepitaxial such films previously in order to improve the quality of silicon films deposited on yttria stabilized cubic zirconia substrates. The objects of this invention were accomplished because of the recent success achieved in growing heteroepitaxial silicon on cubic zirconia. This, in turn, initiated a considerable research effort in an attempt to provide a better quality silicon film on cubic zirconia and other ceramics that demonstrate high oxygen ion mobility. The main object of this research effort was to change the properties at the silicon-insulator interface thereby producing a silicon film with better properties than those displayed by of the as-deposited film.

It is known that the lattice parameters and the thermal expansions of silicon films and the ceramic insulators on which they have been deposited are different. These differences lead to strain in the film and a defect structure that makes the properties of the film different from that of bulk silicon.

The present invention, therefore, provides the means to improve the properties of the silicon film and utilize the high oxygen mobility of the YSZ substrate. It was found that after the deposition of an epitaxial silicon film onto the surface of a cubic zirconia substrate, the substrate is still black from the loss of oxygen due to the high temperature etch employed prior to film deposition. After film deposition, even at relatively low temperature (such as ~450° C.), the blackened substrate could be transformed into a transparent one by exposure to $O_2$ or an oxygen-or moisture-containing ambient environment. When "reoxidized", the oxygen ions can, at elevated temperatures and in an oxygen-containing and possibly even an inert atmosphere, be used to transform the composition at the silicon-ceramic interface layer to one that possesses a better thermal expansion match to the silicon than the sunbstrate.

The oxidation process may be performed in several ways. Ideally, in order to minimize the defect structure in the silicon film after deposition, conversion of the interface is best performed immediately after the composite is formed and before the temperature is lowered. This requires a change in ambient to one containing oxygen and a preferred oxidation temperature that changes the interface composition without completely converting the silicon film exposed to the ambient. It is necessary first to passify the silicon surface, for example, by coating it with a nitride such as $Si_3N_4$, or converting it to a nitride before the oxidation process is begun. Alternately, the substrate conversion and subsequent film conversion can be performed external to the silicon growth reaction and under presumably less favorable but perhaps conditions sufficient to improve the silicon film properties.

By generating a $SiO_2$ or modified $SiO_2$ layer at the interface with adjustable thermal expansion, not only are the film properties improved but it may also be possible to remove the film from the substrate and reuse the substrate. Film separation from the substrate could be accomplished by using HF or an HF-containing etchant that selectively attacks the interface material. The silicon film, either attached to the substrate, or detached, can then be further processed into a device useful for a variety of many electronic applications including MOSFETs, CMOS, solar cells, computer applications, calculators, and sensors.

Although cubic zirconia, specifically yttrium-stabilized zirconia, was the substrate of initial concern, there are other different oxygen ion conductors that would be useful in generating the improved product produced by this process.

The Yttria-stabilized, cubic zirconia substrates used as starting materials for the present invention were single-crystal, randomly oriented $(Y_2O_3)_m(ZrO_2)_{1-m}$ boules having nominal yttria mole fractions, m, of 0.09, 0.12, 0.15, 0.18, 0.21, 0.24, and 0.33 and were obtained from two commercial crystal growers. The crystals were grown by the conventional skull melting technique. Initially, boules of composition m=0.09, 0.12, 0.18, and 0.33 were purchased. Additional boules of composition m=0.15, 0.18, 0.21, and 0.24 were acquired at a later stage. All boules, except those having m=0.09, were grown especially for this inventive effort. Single-crystals of the highest yttria content used, m=0.33, had apparently not been grown previously. The m=0.09 boules were standard stock material, used in the jewel industry. Some of the boules were large enough in size to cut substrates of 1.25–5 cm in linear dimensions.

The as-received boules were transparent with an increasingly yellowish hue as the concentration of yttria increased. No gross defects were visible to the eye. The bulk composition of the YSZ material was determined indirectly, by measuring the lattice parameter of oriented, polished wafers, using the X-ray bond technique. Measured values, as well as values previously published in the literature for Hf-free YSZ fall on a straight line parallel to, but slightly below the previously published values. Thus, the relative compositions of the boules are internally consistent.

The processing of the YSZ boules required to produce precisely oriented wafers with an epitaxial quality surface consisted of three operations: (1) orientation to the desired crystallographic axis, (2) slicing into wafers having the above orientation, and (3) lapping and polishing. The orientation of YSZ boules to the three major cubic axes, viz. <100>, <110>, and <111>, was effected by standard X-ray back-reflection Laue techniques. Each boule was first oriented parallel to the desired crystallographic axis to within a few degrees. It was then mounted on an automatic, diamond-blade i.d. saw (Silicon Technology Corp., Oakland, N.J.) and a 30 or 18 mil (0.76 or 0.46 mm) thick slice was cut off. This slice was then re-oriented, the boule was re-aligned on the saw, and the procedure was repeated to obtain a final orientation within less than 1° of the desired crystal axis. Subsequent measurements by means of X-ray diffraction and Rutherford backscattering and channeling spectrometry showed that most wafers were oriented to within less than 0.3° of the desired axis. After the desired orientation had been obtained, 10-30 wafers were sliced from each boule. Typical sawing parameters were 0.25 in/min. at 2000 rpm with liquid cooling. The blade had a 12 mil (0.30 mm) kerf. Initially, the wafer thickness was chosen to be 30 mil (0.76 mm), to allow for possible multiple repolishing, while maintaining a reasonably small thermal gradient during silicon deposition. Later, 18 mil (0.46 mm) thick wafers, similar to commercial sapphire, were also produced. Wafers having the (100) orientation were obtained for m=0.09, 0.12, 0.18, and 0.33, and wafers of the (111) orientation were obtained for m=0.12, 0.18, and 0.33.

The lapping and polishing of the YSZ wafers were performed in a specialized laboratory. Each set of wafers, having the same composition and crystallographic orientation, was lapped and polished separately. The lapping and initial polishing stages achieve material removal and smoothing of the surface by mechanical action. Thus, the abrasive powder used should be harder than the material being polished. Cubic zirconia has a hardness of 8-8.5 on the Moh scale, compared to 9 for sapphire, and 10 for diamond. Initially, diamond slurries of 3 $\mu$m and then 0.5 $\mu$m particle size were used on a cast iron lap and a Pellon pad, respectively. However, the procedure was later standardized to the use of mixtures of $Al_2O_3$ powders of progressively finer particle size in colloidal silica. The last stage consisted of a chemical-mechanical polishing in a mixture of colloidal silica and phosphoric acid at pH=3-4. This chemical polishing helped to reduce damage due to mechanical abrasion. The entire lapping and polishing sequence took about two days per set of wafers.

The method used to grow epitaxial silicon film on YSZ was chemical vapor deposition (CVD). The silicon films were deposited at one atm pressure via the pyrolysis of $SiH_4$ in a vertical, cold-wall quartz reactor. The carrier gas was $H_2$; it passed through a Pd purifier and a liquid-nitrogen cooled trap before being admitted into the reactor. All the gas lines were made of stainless steel. The YSZ substrates were mounted on a 57 mm diameter, SiC-coated graphite susceptor, which was Rf-heated. During silicon growth, the susceptor was rotated continuously, in order to minimize lateral thermal gradients, and thus obtain silicon films having better thickness uniformity. The temperature was monitored on the side of the susceptor by means of an optical pyrometer. The temperatures given here are uncorrected readings; previous calibrations had shown the actual wafer temperature to be lower by 33°-50° C. at 950°-1075° C., respectively. Typical gas flow rates used were 10-100 cm$^3$/min for the mixture 5% $SiH_4$-in-He, and 3000 cm$^3$/min for $H_2$, resulting in silicon deposition rates at 1000° C. of 0.08-0.8 $\mu$m/min. Prior to being loaded in the CVD reactor, the YSZ substrates were degreased in hot trichloroethane, acetone, and methanol, and blown dry with $N_2$ gas. Before each growth experiment, the reactor portion of the system was evacuated to at least $10^{-3}$ Torr pressure, and then filled with purified flowing $H_2$ prior to heating the susceptor.

The 0.5-0.6 $\mu$m thick (100) silicon films used in this study were grown on 425 $\mu$m thick (100) YSZ substates, having compositions $(Y_2O_3)0.15$ $(ZrO_2)0.84(HfO_2)0.01$, samples A, and $(Y_2O_3)0.21(ZrO_2)0.78(HfO_2)0.01$, samples B and C. The YSZ substrates were processed using commercially grown single-crystal boules. The silicon deposition temperatures and rates were 945° C. and 0.56 $\mu$m/min (sample A), 1000° C. and 0.12 $\mu$m/min (sample B), and 945° C. and 0.11 $\mu$m/min (sample C). Each sample, initially 7-10 cm$^2$ in size, was split into smaller pieces, and a 0.09 or 0.17 $\mu$m thick $Si_3N_4$ layer was deposited on top of the silicon surface in a low-pressure reactor at 800° C. (45 min) or 820° C. (36 min), using the pyrolysis of $SiCl_2H_2$ and $NH_3$.

The purpose of the $Si_3N_4$ was to protect the top silicon surface from oxidation during subsequent processing. Next, several oxidation runs were performed on separate samples. In the wet oxidation runs at 925° C., the following sequences were used: 10 min $N_2$, 100 min (or 360 min) pyrogenic steam, and 30 min $N_2$. In the dry oxidation run at 1100° C., the samples were annealed in dry oxygen for 270 min. Bulk (100) Si wafers were included for reference in all runs, and the 360 min, 925° C. steam run also included $Si_3N_4$-capped 0.6 $\mu$m SOS and $\approx$2 $\mu$m Si/bulk spinel samples.

After oxidation, the samples were analyzed by RBS without removal of the $Si_3N_4$, and also by RBS/channeling after the $Si_3N_4$ layer had been removed in hot $H_3PO_4$. These measurements were performed both at a large scattering angle ($\theta \approx 150°$) and in a grazing-exit geometry ($\theta \approx 100°$). The latter arrangement provided a background-free signal for the top half of the silicon film in the Si/YSZ composite sample, and thus enabled an accurate measurement of the surface and near-surface channeling yields to be made. Silicon film thicknesses were also measured with a Nanospec spectrophotometric reflectometer (Nanometrics, Sunnyvale, Calif). The in-plane macro-strain in the silicon films was determined by measuring the silicon lattice parameter perpendicular to the plane of the film, using double-crystal X-ray diffractometry. The lattice parameters of the YSZ substrates, needed as reference values, were measured separately. The volume concentration of the [221] microtwins in the silicon films, relative to the (100) Si matrix, was measured using full-circle X-ray goniometry. The sheet resistance of the silicon films was also measured by means of a high-sensitivity four-point probe (Model 101, Four Dimensions, Inc., Hayward, Calif). Several samples were analyzed by Auger electron spectroscopy (AES) combined with sputter profiling.

The RBS channeling spectra showed that following oxidation, an $SiO_2$ layer had formed at the Si/YSZ interface in all the samples. The layer was stoichiometric $SiO_2$, within the experimental accuracy, and it was not single-crystalline, having a channeling yield of unity throughout its thickness. From the known properties of thermal silicon oxides, it is believed that the $SiO_2$ layer was amorphous, rather than fine-grained polycrystalline. From the RBS and AES measurements, there was no indication of bulk-level metallic constituents in the $SiO_2$. The thickness of the $SiO_2$ layer varied from 650 Å to 3200 Å (see Table I), depending on the particular sample and oxidation conditions. The oxides formed in pyrogenic steam were thicker and more uniform laterally than those formed in dry oxygen, for oxidation conditions resulting in equal oxide thicknesses on bulk (100) silicon. The oxides formed through the zirconia substrates with the 21% mol yttria content were in general slightly thicker than those formed through the substrates with the 15% mol yttria content, for both wet and dry oxidation conditions. The $SiO_2$ layers obtained on (100) bulk silicon control samples under the same experimental conditions were thicker by factors of 1.8–4.5 compared to those formed at the Si/YSZ interface (see Table I). No interfacial $SiO_2$ could be detected in a 0.6 μm SOS sample following a 6 h steam oxidation at 925° C.

TABLE I

Thickness of thermal $SiO_2$ layers formed at the Si/YSZ interface by diffusion of oxidizing species through the YSZ substrates. Sample A = 0.55 μm (100) Si/(100) $(Y_2O_3)0.15\ (ZrO_2)0.84\ (HfO_2)0.01$; samples B/C = 0.58/0.52 μm (100) Si/100) $(Y_2O_3)0.21\ (ZrO_2)0.78\ (HfO_2)0.01$. The range of values represents lateral variation. $SiO_2$ thicknesses formed under the same conditions on bulk (100) Si wafers are shown for comparison.

| Sample # | Oxidation Run $SiO_2$ Thickness (μm) | | |
|---|---|---|---|
| | $2H_2/O_2$, 925° C. | | $O_2$, 1100° C. |
| | 1.67 h | 6 h | 4.5 h |
| A | 0.115–0.149 | 0.32 | 0.065–0.094 |
| B/C | 0.163–0.173 | 0.23–0.29 | 0.079–0.134 |
| Bulk Si | 0.29 | 0.66 | 0.29 |

The X-ray and ion channeling data for sample A, as deposited and following dry or wet oxidations, are given in Table II; similar results were obtained for samples B and C. The depth-averaged concentration of (111) orientated microtwins in the silicon film decreases significantly following the back-side oxidations; the thicker the interfacial $SiO_2$ layer, the lower the final microtwin concentration, e.g., after the 6 h, 925° C. steam oxidation, where 30% of the initial silicon film was converted to $SiO_2$, the microtwin concentration was reduced by a factor of 2.4. This result is expected, since the present and our previous ion channeling data have shown that the concentration of the planar crystallographic defects is approached. Thus, the back-side oxidation removes the most defective portion of the silicon film. The observed 30% reduction in the width of the X-ray rocking curve following either dry or wet oxidation also indicates an overall reduction in defect density in the silicon films. The in-plane compressive strain increased slightly following oxidation. By comparison, reductions of 13–23% in the width of the silicon rocking curve have been observed in Si/YSZ films annealed in flowing $N_2$ at 1000° C. for 2 h, where RBS measurements showed no chemical reaction at the Si/YSZ interface. The in plane strain was found to have slightly increased in one case and decreased in the other in those films. The ion channeling data for the Si/YSZ films with the thinner interfacial $SiO_2$ layers indicate that the surface crystalline quality of the silicon films was essentially unchanged following interface oxidation, as expected. A slight increase in $\chi_o$ in the wet-oxidized film was probably due to the slightly lower initial silicon film thickness (and thus higher initial defect density), and in the dry-oxidized film to an $H_3PO_4$ underetching, which left an 84 Å thick $Si_3N_4$ film on the silicon surface (thus causing some dechanneling of the $^4He^+$ beam) The dechanneling rates were essentially unchanged following wet oxidation but increased slightly following dry oxidation.

The depth-averaged resistivities of the silicon films, measured following a brief dip in a 10% HF solution, were essentially unchanged after the wet oxidations at 925° C. (5–10 Ωcm for sample A, 13–22 Ωm for sample B), but decreased by about an order of magnitude after the dry oxidation at 1100° C. (0.8 Ωm for sample A, 1.6 Ωm for sample B).

RBS and AES measurements also detected the presence of an $SiO_xN_y$ layer, less than 200 Å thick, and possible discontinuous, on the unpolished YSZ side of the samples, following oxidation. This layer may have formed as $Si_3N_4$ during the deposition of the thicker nitride on the silicon surface, and subsequently been partly oxidized.

TABLE II

Results of x-ray diffraction measurements and 1.5 MeV $^4He^+$ channeling of the Si film in sample A in the as-deposited state and after wet or dry oxidation, as indicated. $t_{Si}$ = Si film thickness, $t_{SiO2}$ = $SiO_2$ film thickness at Si/YSZ interface, [twins] = depth-averaged concentration of (111) oriented microtwins, $\epsilon_{11}$ = in-plane macro-strain, $\Delta\omega$ = rocking-curve width, $\chi_o$ = surface channeling yield, $d\chi/dz$ = depth-averaged dechanneling rate.

| Sample A | As Deposited | $2H_2/O_2$, 925° C. | | $O_2$, 1100° C.* |
|---|---|---|---|---|
| | | 1.67 h | 6 h | 4.5 h |
| $t_{Si}$ (μm) | 0.553 | 0.477 | 0.361 | 0.524 |
| $t_{SiO2}$ (μm) | — | 0.135 | 0.324 | 0.065 |
| [twins] (% vol) | 5.1 | 3.7 | 2.2 | 4.2 |
| $\epsilon_{11}$ $(10^{-3})$ ⊕ | −5.5 | −5.8 | −5.8 | −5.9 |
| $\Delta\omega$ (min of arc) | 20.3 | 15.1 | 14.2 | 15.6 |
| $\chi_o$ | 0.067 | 0.076 | — | 0.089 |
| $d\chi/dz$ (μm$^{-1}$) | 0.97 | 0.93 | — | 1.05 |

*84 Å of $Si_3N_4$ had not been etched off the dry-oxidized sample.
⊕ To convert strain into stress in kbar or dyne/cm$^2$, multiply by $1.802 \times 10^3$ or $1.802 \times 10^{12}$, respectively.

The formation of the $SiO_2$ layer at the Si/YSZ interface is believed to have taken place by the diffusive transport of oxidizing species through the 425 μm thick YSZ substrate. The dividing force for diffusion through the YSZ is the difference inoxygen chemical potentials, $\Delta\mu(O_2)$, between the YSZ/ambient and Si/YSZ (initially) or $SiO_2$/YSZ interfaces. Without such a driving force, silicon cannot completely reduce $ZrO_2$, or $HfO_2$, or $Y_2O_3$, to form $SiO_2$, because the Gibbs free energies of these reduction reactions are all positive and large 42.5, 45, and 74 kcal/mol $O_2$, respectively, at 925° C., with similar values at 1100° C. This statement was verified by the lack of any chemical reaction or intermediate compounds at the Si/YSZ interface in samples annealed for 2 h in flowing $N_2$ at 850° C. or 1000° C. Although the exact nature of the diffusing oxidizing species is not known, they probably involve $O^{--}$ ions in the dry oxidation process and $O^{--}$ or $OH^-$ ions and possible protons in the wet oxidation process.

It is noteworthy that the $SiO_2$ films formed at the Si/YSZ interface are stoichiometric and contain no apparent bulk metallic impurities. In fact, the cubic zirconia substrate acts as a selective filter, allowing passage of oxygen only, while Zr, Hf, Y, and external metallic impurities are blocked, since their diffusivities are many orders of magnitude smaller than that of oxygen. Snowplowing of metals into the growing $SiO_2$ film is also prevented by the fact that the reduction of the metal oxides by silicon is not favored thermodynamically.

The elimination by oxidation of the most defective, near-interface region in the as-deposited Si/YSZ film is very significant, potentially reducing the density of states there. The $Si/SiO_2$ interface is also relatively well understood. An additional advantage for integrated circuit applications is that the dielectric constant of a-$SiO_2$ is 3.9, about ten times lower than that of YSZ, resulting, for appropriately thick $SiO_2$ layers ( 0.5 $\mu$m), reduced parasitic capacitance and increased operating speed.

The crystalline quality of the silicon films after formation of the interfacial $SiO_2$ layer was improved by the reduced concentration of the {221} microtwins and the narrower X-ray rocking curves. Since these defects are known to be responsible for the increased back-channel leakage and reduced mobility in metal-oxide-semiconductor (MOS) transistors, it is expected that the performance of such devices fabricated in $Si/SiO_2$/YSZ films will be improved. In order to obtain an even larger reduction in microtwin density, a larger amount of silicon, of the order of 0.25 $\mu$m (corresponding to 0.56 $\mu$m $SiO_2$) must be oxidized. In principle, there need be no upper limit to the attainable $SiO_2$ thickness, as long as the gradient in the oxygen chemical potential exists between the $SiO_2$/YSZ and the YSZ/ambient interfaces.

An additional, technologically important benefit of the back-side oxidation of Si/YSZ to form Si/a-$SiO_2$/YSZ is that this oxidation process can be combined with a recrystallization of the silicon film without damaging the underlying YSZ. In the $Si/Al_2O_3$ case, any recrystallization of the silicon at the interface, whether by silicon ion implantation-amorphization and regrowth or by laser irradiation and liquid-phase epitaxy, results in some damage to the $Al_2O_3$ and release of electrically active aluminum into the silicon film. While Zr and Hf are not electrically active in Si and Y only has deep levels in Si it is still desirable not to damage the YSZ side of the interface, while fully recrystallizing the silicon side, e.g., by silicon ion implantation and solid-phase regrowth. The present oxidation process affords this possibility.

Another possible use of the Si/a-$SiO_2$/YSZ structure is as a simple means of removing the epitaxial silicon film for its subsequent characterization by TEM and RBS/channeling. Alternately, the silicon film could be etched off (e.g., by sputtering), leaving a protective $SiO_2$ coating on the YSZ substrate, which could be removed in-situ before re-use in silicon epitaxy. Finally, the structure Si/a-$SiO_2$/YSZ is of basic scientific interest, since it consists of a single-crystal film (Si), which is macroscopically coherent with a different single-crystal substrate (YSZ), but is physically separated from it by an amorphous film ($SiO_2$). A 0.54 m thick thermal $SiO_2$ layer has been formed through a 0.1 $\mu$m thick single-crystalline epitaxial spinel film on silicon by a 1.5 h annealing in pyrogenic steam at 1100° C. The corresponding $SiO_2$ thickness on bare silicon under the same conditions was 0.63 $\mu$m. No $SiO_2$ could be formed through the thin spinel film in dry oxygen, in contrast to the results presented in this invention. As in the case of YSZ, the reduction of MgO or $Al_2O_3$ by Si is not favored thermodynamically.

It is also noted that in the present $Si/SiO_2$/YSZ system, the $SiO_2$ layer is in contact with the technologically important silicon region, where the devices will be located, in contrast to the previously described Si/foreign oxide/$SiO_2$/bulk Si systems.

In this invention, it has been demonstrated that the thermal oxidation of the silicon side of a <Si>/<YSZ> interface, in either dry oxygen (1100° C.) or pyrogenic steam (925° C.), by the diffusion of oxidizing species through the 425 $\mu$m thick YSZ substrate can be accomplished. In forming this unique dual-layer structure, <Si>/a-$SiO_2$/<YSZ>, use is made of the high mobilities of oxygen and hydroxyl ions in cubic zirconia. This relatively easy transport of oxidizing species, coupled with the blocking of many metallic species (including the major metallic constituents of YSZ) is unique to cubic zirconia and other superionic oxygen conductors, and cannot be achieved in other existing Si/bulk insulator systems, such as SOS. The advantages of the <Si>/a-$SiO_2$/<YSZ> structure are as follows: elimination of the most defective region in the epitaxial Si film, possibility of completely recrystallizing the Si film without introducing foreign impurities (except O), potential for controlling the strain in the silicon film, reduction of the interface state density and formation of a relatively well studied $Si/SiO_2$ back interface, and lowering of the effective dielectric constant and corresponding parasitic capacitances.

While the principles of this invention have been described with particularity, it should be understood by those skilled in the art that various alterations and modifications can be made without departing from the spirit of the invention, and that all such modifications as are included within the scope of the appended claims are intended to be included herein.

What is claimed is:

1. A method for treating films, said method comprising the steps of:
   a. depositing a thin, heteroepitaxial silicon film onto a surface of an insulator substrate being an oxygen ion conductor thereby forming a silicon-substrate interface between said film and said substrate;
   b. protecting the surface of said silicon film from oxidation;
   c. subjecting said substrate to an oxidizing environment at a temperature and for a period of time sufficient to form a silicon dioxide layer at said interface; and
   d. removing said oxidizing environment from said substrate after said silicon dioxide layer reaches a predetermined thickness.

2. A method as defined in claim 1 wherein said oxidizing environmental is selected from the group consisting of dry oxygen and pyrogenic steam.

3. A method as defined in claim 1 wherein said substrate is subjected to said oxidizing environment maintained at about 925° C. and comprising, in sequence, a flow of nitrogen, a flow of said oxidizing environment, and a flow of nitrogen, said flows being for preselected times.

4. A method as defined in claim 1 wherein said substrate is cubic zirconia.

5. A method as defined in claim 4 wherein said substrate is stabilized with a compound selected from the group consisting of yttria and calcium oxide.

6. A method as defined in claim 5 wherein said substrate has the composition $(Y_2O_3)_m(Z_rO_2)_{1-m}$ and said yttria mole fraction is in the range of from about 0.09 to about 0.33.

7. A method as defined in claim 1 wherein a protective layer is deposited on said silicon film before exposing said substrate and said film to said oxidizng environment.

8. A method as defined in claim 7, wherein said protective layer is silicon nitride.

9. A method as defined in claim 1 wherein said substrate has an orientation selected for the group consisting of (111), (110) and (100).

10. A method for treating films, said method comprising the steps of:
 a. depositing a thin, heteroepitaxial silicon film onto a surface of an insulator substrate being an oxygen ion conductor thereby forming a silicon-substrate interface between said film and said substrate;
 b. protecting the surface of said silicon film from oxidation;
 c. subjecting said substrate to an oxidizing environment at a temperature and for a period of time sufficient to form a silicon dioxide layer at said interface;
 d. removing said oxidizing environment from said substrate after said silicon dioxide layer reaches a predetermined thickness; and
 e. separating said silicon film from said substrate by dissolving said silicon dioxide layer at said interface.

11. A method as defined in claim 10 wherein said oxidizing environment is selected from the group consisting of dry oxygen and pyrogenic steam.

12. A method as defined in claim 10 wherein said substrate is subjected to said oxidizing environment maintained at about 925° C. and comprising, in sequence, a flow of nitrogen, a flow of said ozidizing environment, and a flow of nitrogen, said flows being for preselected times.

13. A method as defined in claim 10 wherein said substrate is cubic zirconia.

14. A method as defined in claim 13 wherein said substrate is stabilized with a compound selected from the group consisting of yttria and calcium oxide.

15. A method as defined in claim 10 wherein said substrate has the composition $(Y_2O_3)_m(Z_rO_2)_{1-m}$ and said yttria mole fraction is in the range of from about 0.09 to about 0.33.

16. A method as defined in claim 10 wherein a protective layer is deposited on said silicon film before exposing said substrate and said film to said oxidizing environment.

17. A method as defined in claim 16 wherein a protective layer is silicon nitride.

18. A method as defined in claim 10 wherein said substrate has an orientation selected for the group consisting of (111), (110) and (100).

* * * * *